United States Patent [19]
Izumi

[11] Patent Number: 5,623,163
[45] Date of Patent: Apr. 22, 1997

[54] LEADFRAME FOR SEMICONDUCTOR DEVICES

[75] Inventor: Atsuhiko Izumi, Tokyo, Japan

[73] Assignee: NEC Corporation, Tokyo, Japan

[21] Appl. No.: 307,429

[22] Filed: Sep. 19, 1994

[30] Foreign Application Priority Data

Sep. 20, 1993 [JP] Japan ................... 5-232860

[51] Int. Cl.[6] .................. H01L 23/495; H01L 23/28
[52] U.S. Cl. ................... 257/667; 257/669; 257/674; 257/787
[58] Field of Search .................. 257/667, 666, 257/674, 676, 787

[56] References Cited

U.S. PATENT DOCUMENTS

| | | | |
|---|---|---|---|
| 4,803,544 | 2/1989 | Holzschuh et al. | 257/667 |
| 4,862,246 | 8/1989 | Masuda et al. | 257/667 |
| 4,868,635 | 9/1989 | Frechette et al. | 257/667 |
| 4,894,704 | 1/1990 | Endo | 257/667 |
| 5,150,194 | 9/1992 | Brooks et al. | 257/667 |

FOREIGN PATENT DOCUMENTS

| | | | |
|---|---|---|---|
| 0096360 | 4/1990 | Japan | 257/667 |
| 2-186647 | 7/1990 | Japan . | |
| 0152488 | 6/1993 | Japan | 257/667 |
| 0343587 | 12/1993 | Japan | 257/667 |

Primary Examiner—Sara W. Crane
Assistant Examiner—David Ostrowski
Attorney, Agent, or Firm—Burns, Doane, Swecker & Mathis, LLP

[57] ABSTRACT

A leadframe for semiconductor derides having patterned die-mounting structures arranged along the longitudinal axis of the leadframe. Each of the structures contains a die pad for mounting a semiconductor device chip thereon, die pad supports for supporting the die pad, fingers for forming inner leads and outer leads, and tiebars for preventing leakage of a molding material during a molding process. At least one of the die pad supports has a first communication path through which a molding material flows from one side of the body to the other thereof. The molding material supplied into one side of the leadframe can flow to the other side thereof through not only the gaps between the die pad and the body but also the first communication path during a molding process, resulting in a small flow rate difference of the molding material. Failures such as visible voids and no fillings are not produced in the plastic-molding package.

26 Claims, 10 Drawing Sheets

LEADFRAME FOR SEMICONDUCTOR DEVICES

BACKGROUND OF THE INVENTION

1. Field of the Invention

The present invention relates to a leadframe used for semiconductor devices and more particularly, to a leadframe used for plastic-molded packages of semiconductor devices such as LSIs.

2. Description of the Prior Art

A conventional leadframe 38 of this type has a body, a pair of rails extending along a longitudinal axis of the body and formed at each side thereof, and a plurality of patterned die-mounting structures as shown in FIG. 1. The structures are typically formed through an etching or stamping process. The leadframe 38 is usually made of an iron system alloy such as Alloy 42 or a copper system alloy.

Though the die-mounting structures are aligned along the longitudinal axis of the body at regular intervals, only one of the structures is shown in FIG. 1 for the sake of simplification of description.

As shown in FIG. 1, each of the die-mounting structures includes a square die pad 35 for mounting a semiconductor die or chip thereon, four die pad supports 37 for supporting the die pad 35, four sets of fingers for forming inner leads 31 and outer leads 32, and four sets of tiebars or dam-bars 34 for preventing leakage of molding material or compound during a molding process step.

The square die pad 35 is positioned at the middle point of the lead frame 38. Each of the sets of the fingers and corresponding one of the sets of the tiebars 34 are arranged to be opposite to each side of the die pad 35. Each of the tiebars 34 is formed to interconnect the adjacent two fingers the end-positioned finger and the body of the leadframe 38. Each of the sets of the tiebars 34 are aligned along each side of an imaginary square.

Each of the die pad supports 37 extends from a corresponding corner of the imaginary square to an opposing corner of the die pad 35 so that it mechanically connects the die pad 35 to the body. As a result, the die pad 35 is supported only by the die pad supports 37.

The four sets of the fingers are formed to protrude from the peripheral part toward the four sides of the die pad 35, respectively. The inner parts of the fingers, which are near the die pad 35, act as the respective inner leads 31 and the outer parts of the fingers, which are far from the die pad 35, act as the respective outer leads 32.

Three first pilot holes 36a and three second pilot holes 36b are formed in each of the rails to accurately locate the lead frame 38 on a lower mold of a molding die during a molding process step.

With the conventional leadframe 38 described above, chip mounting, wire bonding and plastic molding processes are carried out through the following process steps.

First, the leadframe 38 is placed horizontally on the lower mold (not shown) of the molding die at a given position as shown in FIG. 2A, and then, a semiconductor device or LSI chip 39 is mounted or fixed using silver paste 40, as shown in FIG. 2B.

Next, as shown in FIG. 2C, the inner leads 31 are electrically connected with bonding pads (not shown) of the LSI chip 39 through pieces 41 of a bonding wire, respectively.

Then, as shown in FIG. 2D, the chip 39, the die pad 35, the pieces 41 of the bonding wire and the inner leads 31 are transfer-molded by a thermoset molding material such as an epoxy resin, resulting in a plastic package 42. The tiebars 34 and the outer leads 32 are in the outside of the package 42.

After removing the tiebars 34 by cutting, a given metal film 43 is formed to cover the outer leads 32 by a plating process, and then, the outer leads 32 thus plated are partially cut in a lead trimming process, as shown in FIG. 2F.

Finally, the outer leads 32 thus trimmed are bent to given shapes in a lead forming process, resulting in a plastic-molded semiconductor device or LSI as shown in FIG. 2G.

A detailed description about the transfer-molding process shown in FIG. 2D is shown below referring to FIG. 3.

A molding material or synthetic resin 48 is preheated to a given temperature to melt and is temporarily stored in a pot 47 of a lower mold 46 of a molding die 45. The lower mold 46 has a cavity 52a. On the other hand, as shown in FIG. 2C, the leadframe 38 having the semiconductor chip 39 and the pieces 41 of the bonding wire is positioned on the lower mold 46 using the first and second pilot holes 36a and 36b.

Subsequently, an upper mold 49 of the molding die 45, which has a cavity 52b, is lowered to be coupled with the lower mold 46, providing a molding space made of the cavities 52a and 52b in the molding die 45. At this time, the body of the leadframe 38 is put between the upper and lower molds 45 and 46 so that the leadframe 38 is securely held. The LSI chip 39, the bonding-wire pieces 41 and the inner leads 31 are placed in the molding space.

A plunger (not shown) provided under the melted molding material 48 ascends to push out the material 48 stored in the pot 47 into a runner 50 of the lower mold 46. The melted material 48 flows in the runner 50 toward the lower cavity 52a as shown by an arrow A', passes through a gate 51 formed at an end of the runner 50 as shown by an arrow B', and go into the lower cavity 52a.

Since the runner 50 and the gate 51 are formed in the lower mold 46 and the leadframe 38 is placed at an interface of the upper and lower cavities 52a and 52b, the melted material 48 flows, first, into the lower cavity 52a as shown by an arrow C'. The melted material 48 in the lower cavity 52a then flows into the upper cavity 52b through gaps or openings between the die pad 35 and the peripheral part or body of the leadframe 38 as shown by an arrow D'. In other words, the melted material 48 branches to flow in the upper and lower cavities 52a and 52b.

The melted material 48 flowing in the lower and upper cavities 52a and 52b goes toward opposite ends of the cavities 52a and 52b, as shown by arrows E', and F' respectively, so that the cavities 52a and 52b are filled with the melted material 48.

During this filling process, the atmospheric air confined in the cavities 52a and 52b is discharged through an air vent 54 formed at the end of the lower mold 46 opposite to the gate 51.

The melted material 48 thus filled is then cured, and the semiconductor chip 39, the bonding wire pieces 41 and the die pad 35 are molded by the material 48, resulting in the plastic package 42 made of the material 48.

Subsequently, the upper mold 49 is raised to be apart from the lower mold 46, and the leadframe 38 with the semiconductor chip 39 thus molded are taken out from the lower cavity 52a.

The cured molding material 48 remaining at the runner 50 and the gate 51, that is, burrs or flushes, are then removed. Thus, the molding process step is finished.

With the conventional plastic-molded semiconductor device described above, there are problems that visible voids or bubbles easily arise in the plastic package 48 after the curing process and that a failure called "no filling" of the cavities 52a and 52b occasionally arises due to insufficient injection of the molding material 48 into the cavities 52a and 52b.

The above problems are due to the following facts:

The gaps between the die pad 35 and the peripheral part or body of the leadframe 38 have become narrower due to increase in pin count and decrease in outer lead-pitch through down-sizing, so that the melted molding material 48 flows with difficulty from the lower cavity 52a to the upper cavity 52b through the gaps. Accordingly, there arises flow rate difference between the molding material 48 flowing in the lower and upper cavities 52a and 52b, resulting in the above failures.

For example, in the case of a Quad Flat Package (QFP) of an LSI with 304 pins or outer leads, the following testing results have been obtained:

When one hundred (100) semiconductor devices or LSIs are transfer-molded under the condition that each of gaps between the adjacent inner leads 31 and each of the gaps between the respective die pad supports 37 and the inner leads 31 adjacent thereto are both 100 μm, the failure of the "no filling" is found in forty (40) of the devices thus molded. This means a very high failure rate of 40%.

To solve the above problems, an improved molding technique was developed, which is disclosed in the Japanese Un-Examined Patent Publication No. 2-186647.

With this molding technique, an upper mold of a molding die has a second gate at a position opposite to that of a first gate of a lower mold of the molding die, and a leadframe has a communication hole for communicating the first and second gates with each other when the leadframe is securely held between the upper and lower molds coupled together.

A melted molding material or synthetic resin flows through the first gate into a cavity of the lower mold and at the same time, the molding material flows through the communication hole and the second gate into a cavity of the upper mold. Therefore, the flow rates of the material in the lower and upper cavities becomes substantially equal to each other, avoiding the above failures.

However, there is a problem that since the molding material remaining at the second gate of the upper mold is difficult to be removed after a curing process, an additional process step is required for removing this remaining material on the upper mold, resulting in increase in fabrication cost.

SUMMARY OF THE INVENTION

Accordingly, an object of the present invention is to provide a leadframe for semiconductor devices that arises no failures such as visible voids or bubbles and no fillings in the molding package of the plastic-molded semiconductor device.

Another object of the present invention is to provide a leadframe for semiconductor devices that requires no additional process steps such as a process step of removing the remaining molding material on the upper mold during and after the molding process.

The leadframe of the present invention has a body, first and second rails extending along a longitudinal axis of the body and formed at each side thereof, and patterned die-mounting structures arranged along the longitudinal axis between the first and second rails.

Each of the structures includes a die pad for mounting a semiconductor device chip thereon, die pad supports for supporting said die pad, fingers for forming inner leads and outer leads, and tiebars for preventing leakage of a molding material. The tiebars are formed to link the adjacent fingers together.

At least one of the die pad supports has a first communication path through which the molding material flows from one side of the body to the other thereof.

The first communication path may be any structure if the molding material can flow from one side of the body to the other thereof through the path. The first path may be a hole or holes passing through corresponding one of the die pad supports, and may be a recess or recesses formed at an edge or edges of the corresponding one of the supports.

Preferably, the first communication path is disposed in one of the die pad supports, which is nearest to a gate of a mold.

In the case of a plurality of the first communication paths, all of the communication paths may be formed at only one of the supports, and they may be formed to be distributed to two or more of the supports.

Preferably, in addition to the first communication path, at least one of the inner leads has a second communication path.

Similar to the first communication path, the second communication path may be any structure if the molding material can flow from one side of the body to the other thereof through the path. The second communication path may be a hole or holes passing through corresponding one of the die pad supports, and may be a recess or recesses formed at an edge or edges of the corresponding one of the supports.

With the leadframe of the invention, since at least one of the die pad supports has the first communication path, the molding material supplied into one side of the body can flow to the other side thereof through not only the gaps between the die pad and the body but also the first communication path during a molding process. Therefore, the molding material can flow into both molding cavities disposed at both sides of the body at a small flow rate difference (or at substantially the same flow rate) during the molding process As a result, there arises no failures such as visible voids or bubbles and no fillings in the plastic-molding package of the semiconductor device.

DESCRIPTION OF THE PREFERRED EMBODIMENTS

Preferred embodiments of the present invention will be described bellow while referring to FIG. 4, FIGS. 5A to 5G, and FIGS. 6 to 8.

[FIRST EMBODIMENT]

Figure 1:
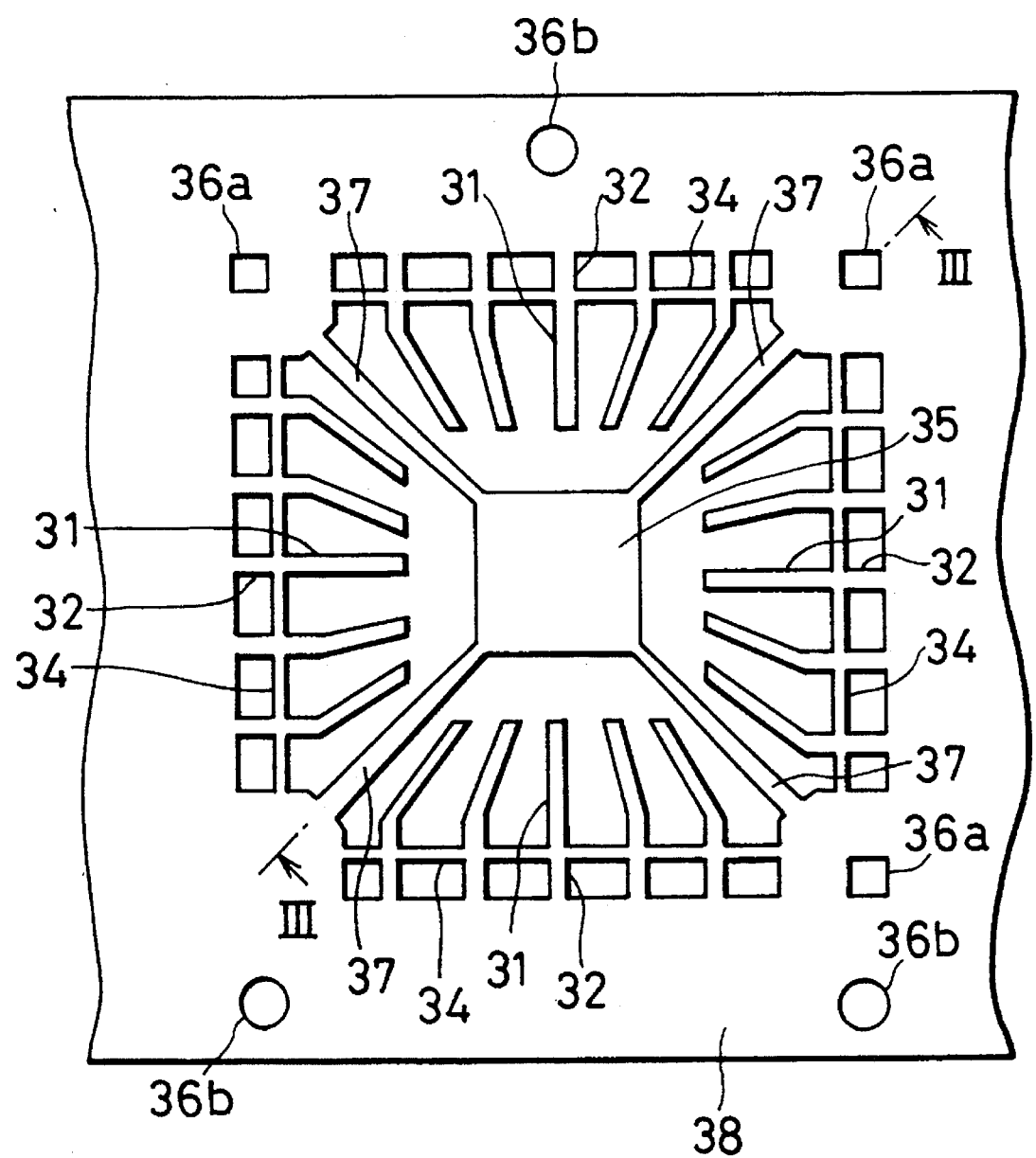
FIG. 1 is a partial plan view of a conventional leadframe for semiconductor devices.
Figure 2A:
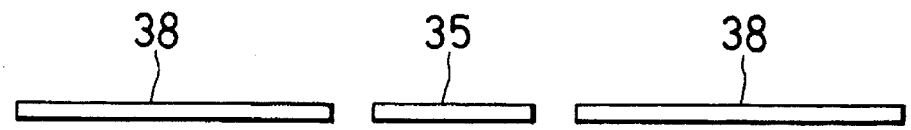
FIGS. 2A to 2G are partial cross-sections showing a molding process of the conventional leadframe shown in FIG. 1, respectively.
Figure 2B:
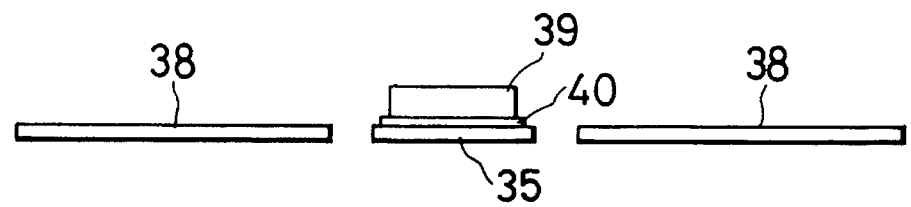
Figure 2C:
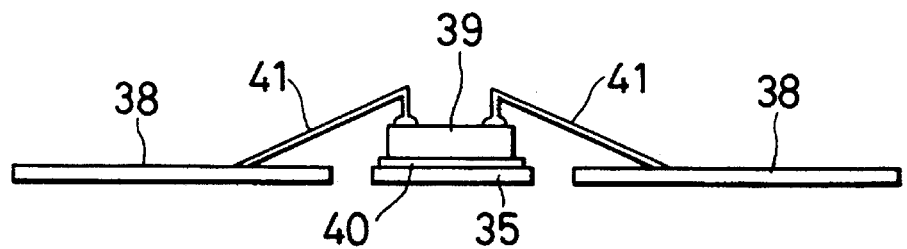
Figure 2D:
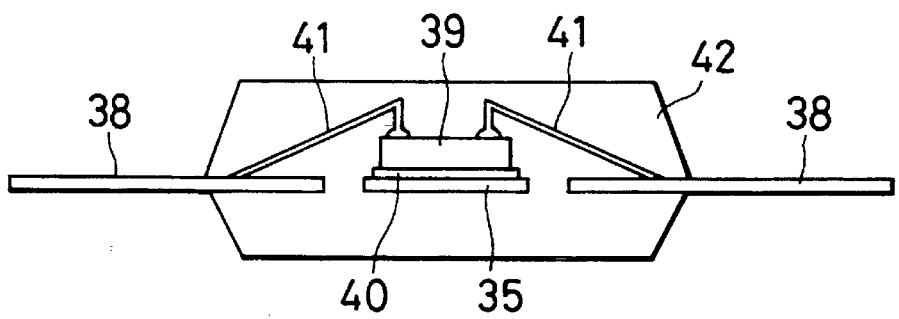
Figure 2E:
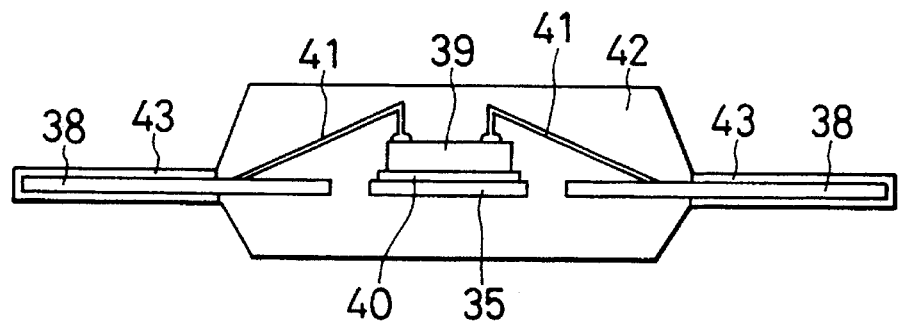
Figure 2F:
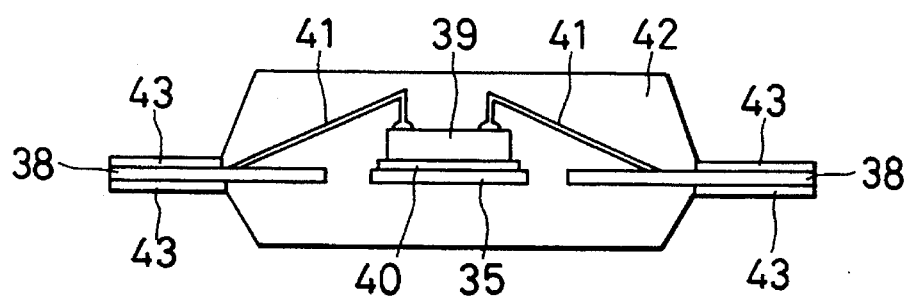
Figure 2G:
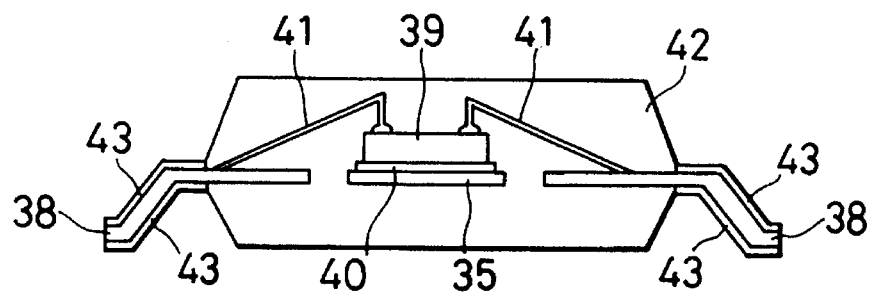
Figure 3:
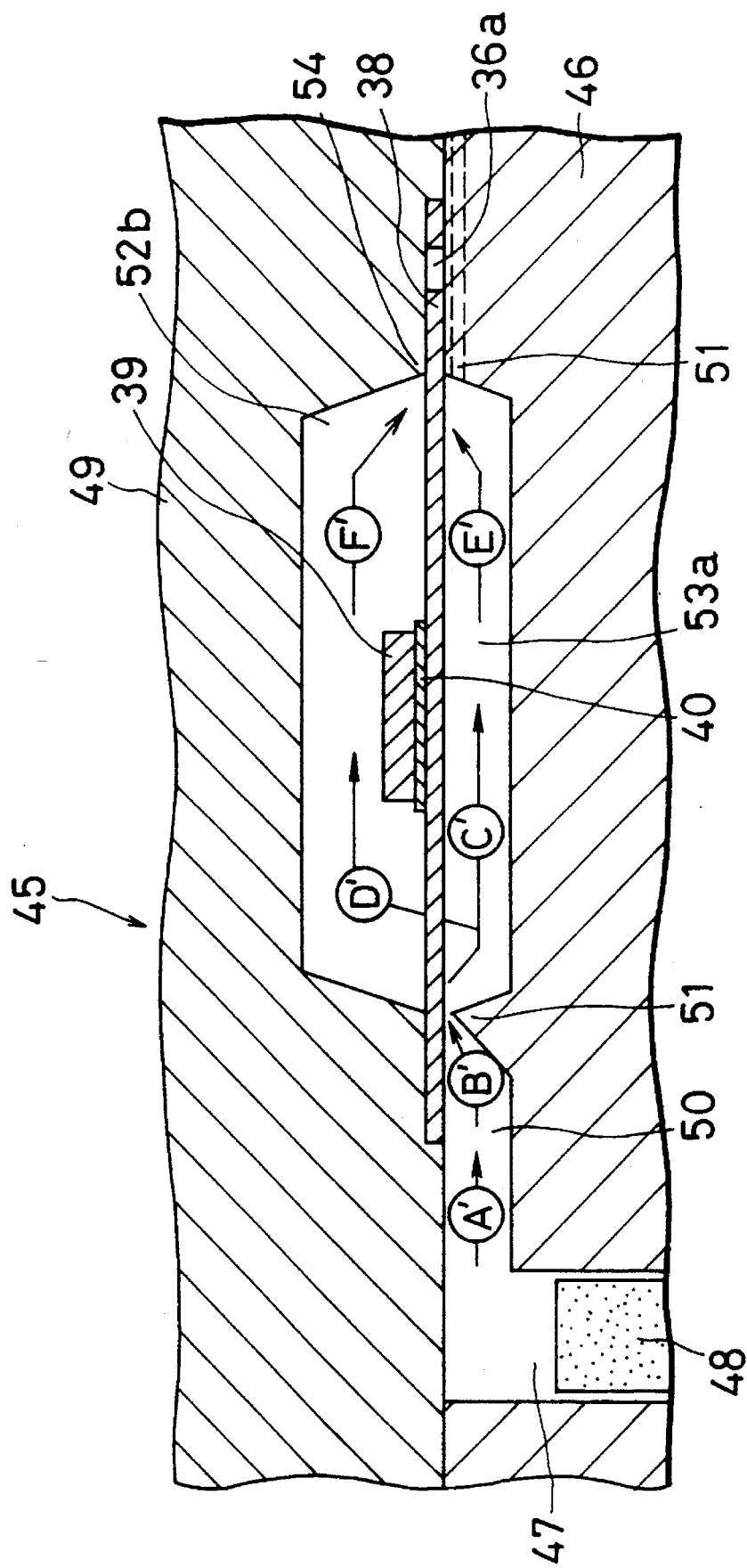
FIG. 3 is a partial cross-section showing the molding process of the conventional leadframe shown in FIG. 1 in detail.
Figure 4:
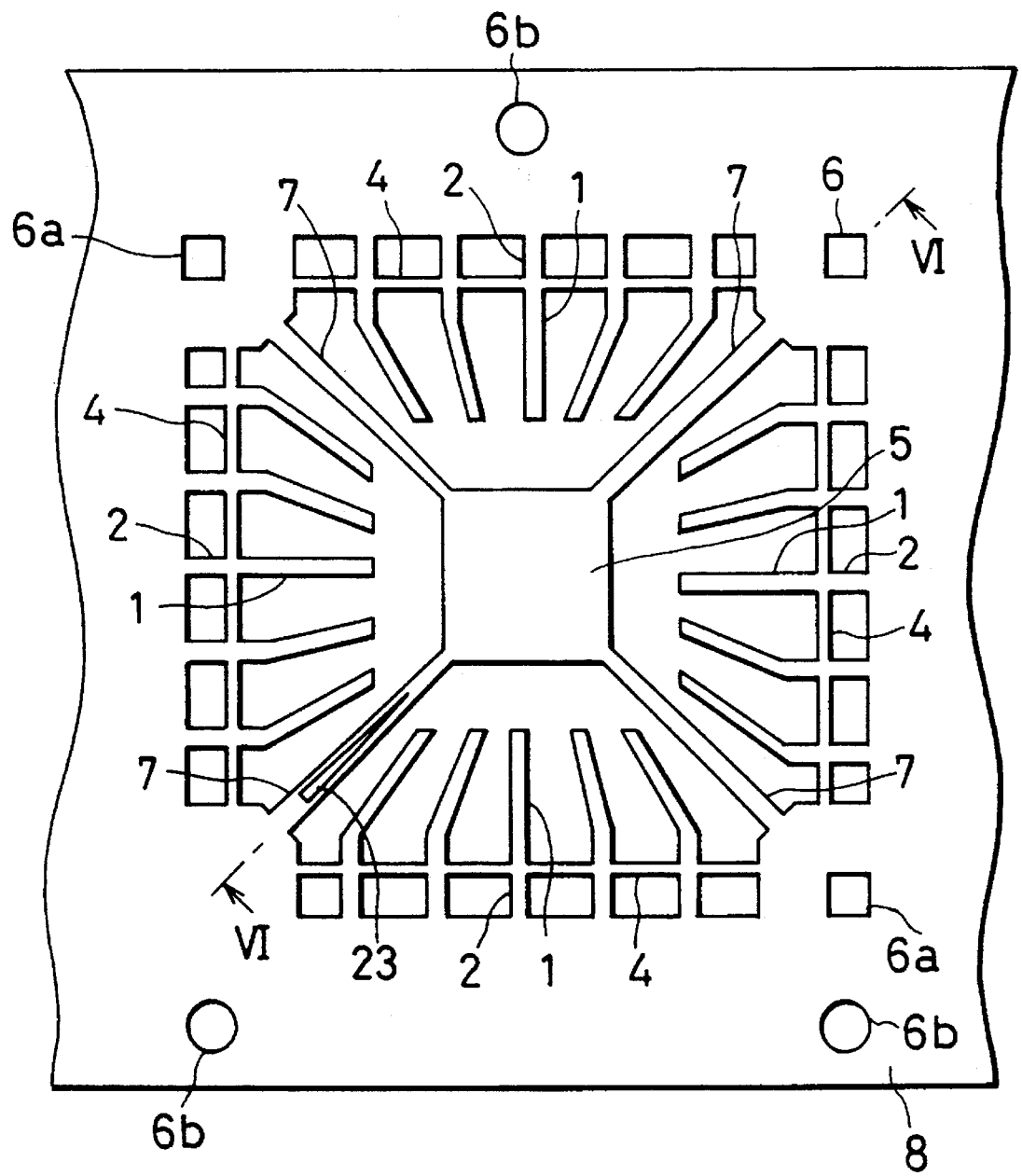
FIG. 4 is a partial plan view of a leadframe for semiconductor devices according to a first embodiment of the present invention.

As shown in FIG. 4, a leadframe 8 for semiconductor devices according to a first embodiment has a body, a pair of rails extending along a longitudinal axis of the body and formed at each side thereof, and a plurality of patterned die-mounting structures as shown in FIG. 4 arranged along the longitudinal axis between the first and second rails. The structures are typically formed through an etching or stamping process. The leadframe 8 is made of an iron system alloy such as Alloy 42 or a copper system alloy.

Though the die-mounting structures are aligned along the longitudinal axis of the body at regular intervals, only one of the structures is shown in FIG. 4 for the sake of simplification of description.

As shown in FIG. 4, each of the die-mounting structures includes a square die pad 5 for mounting a semiconductor die or chip thereon, four die pad supports 7 for supporting the die pad 5, four sets of fingers for forming inner leads 1 and outer leads 2, and four sets of tiebars or dam-bars 4 for preventing leakage of molding material or compound during a molding process step.

The die pad 5 is positioned at the middle point of the lead frame 8. Each of the sets of the fingers and corresponding one of the sets of the tiebars 4 are arranged to be opposite to each side of the die pad 5. Each of the tiebars 4 is formed to interconnect the adjacent two fingers or the end-positioned finger and a peripheral part or body of the leadframe 8. Each of the sets of the tiebars 4 are aligned along each side of an imaginary square.

Each of the die pad supports 7 extends from a corresponding corner of the imaginary square to an opposing corner of the die pad 5 so that it mechanically connects the die pad 5 to the body of the lead frame 8. As a result, the die pad 5 is supported only by the die pad supports 7.

One of the supports 7, which is nearest to a gate of a lower mold, has a through hole 23 acting as a first communication path. A molding material flows from one side of the body to the other thereof through the through hole 23.

The fingers are formed to surround the die pad 5 and to extend from the body of the leadframe 8 toward the die pad 5. The fingers do not reach the die pad 5.

The tiebars 4 are formed to link the fingers together. The inner leads 1 are made by inner parts of the fingers near the die pad 5 and the outer leads 2 are made by outer parts thereof far from the die pad 5.

The four sets of the fingers are formed to protrude from the body of the leadframe 8 toward the four sides of the die pad 5, respectively. The inner parts of the fingers, which are near the die pad 5, act as the respective inner leads 1 and the outer parts of the fingers, which are far from the die pad 5, act as the respective outer leads 2.

Three first pilot holes 6a and three second pilot holes 6b are formed in the body to accurately locate the lead frame 8 on a lower mold of a molding die during a molding process step.

Next, chip mounting, wire bonding and plastic molding processes of the leadframe 8 are described below.

Figure 5A:
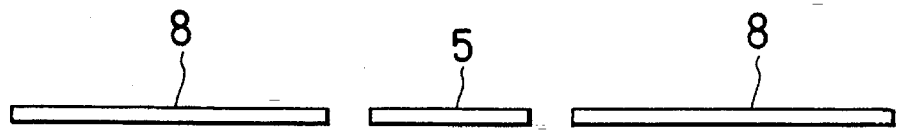
FIGS. 5A to 5G are partial cross-sections showing a molding process of the leadframe of the first embodiment shown in FIG. 4, respectively.
Figure 5B:
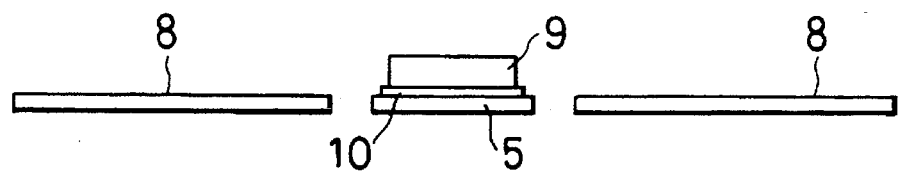

First, the leadframe 8 is placed horizontally on the lower mold (not shown) of the molding die at a given position as shown in FIG. 5A, and then, a semiconductor device or LSI chip 9 is mounted or fixed using silver paste 10, as shown in FIG. 5B.

Figure 5C:
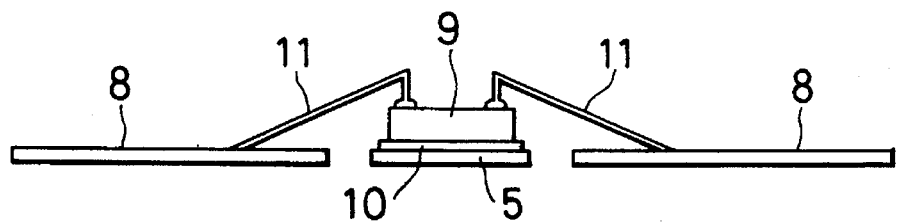

Next, as shown in FIG. 5C, the inner leads 1 are electrically connected with bonding pads (not shown) of the LSI chip 9 through pieces 11 of a bonding wire, respectively.

Figure 5D:
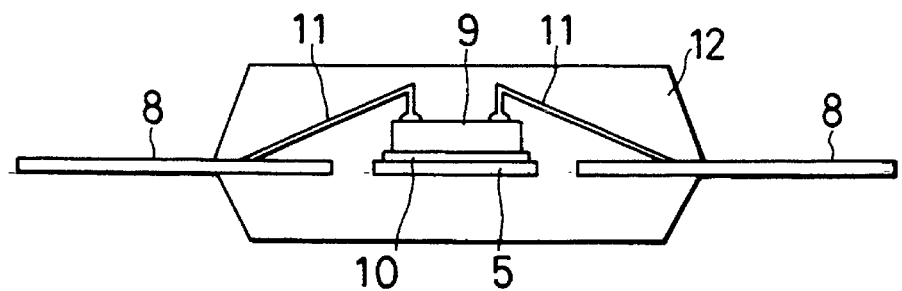
Figure 5E:
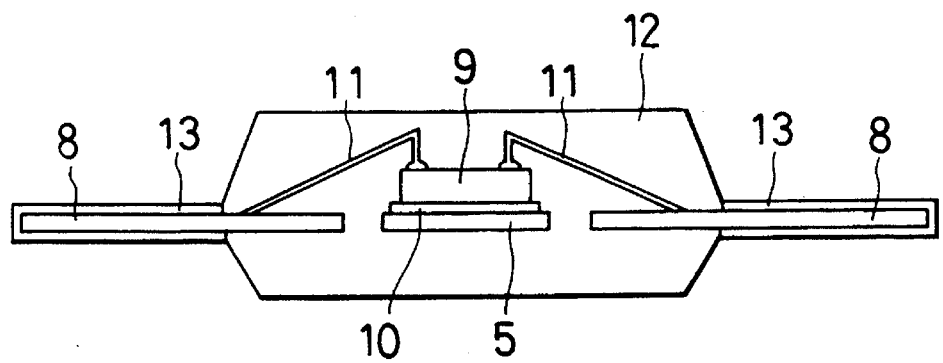

Then, as shown in FIG. 5D, the chip 9, the die pad 5, the bonding wire pieces 11 and the inner leads 1 are transfer-molded by a thermoset molding material such as an epoxy resin, resulting in a plastic package 12. The tiebars 4 and the outer leads 2 are in the outside of the package 12.

Figure 5F:
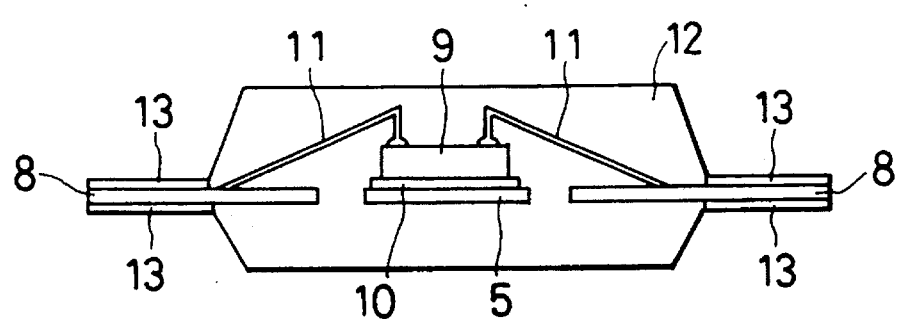

After removing the tiebars 4 by cutting, a given metal film 13 is formed to cover the outer leads 2 by a plating process, and then, the outer leads 2 thus plated are partially cut in a lead trimming process, as shown in FIG. 5F.

Figure 5G:
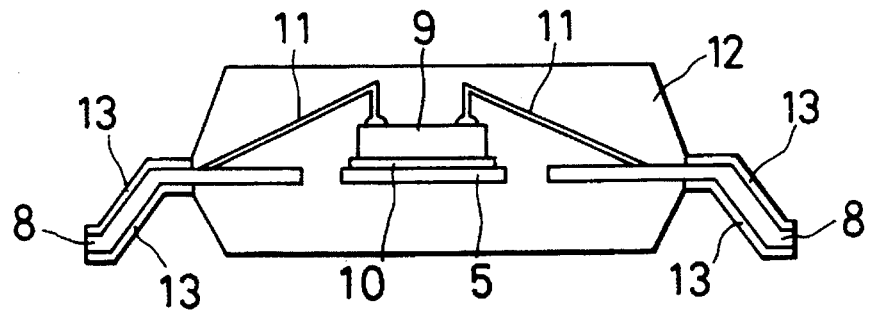

Finally, the outer leads 2 thus trimmed are bent to given shapes in a lead forming process, resulting in a plastic-molded semiconductor device or LSI as shown in FIG. 5G.

Figure 6:
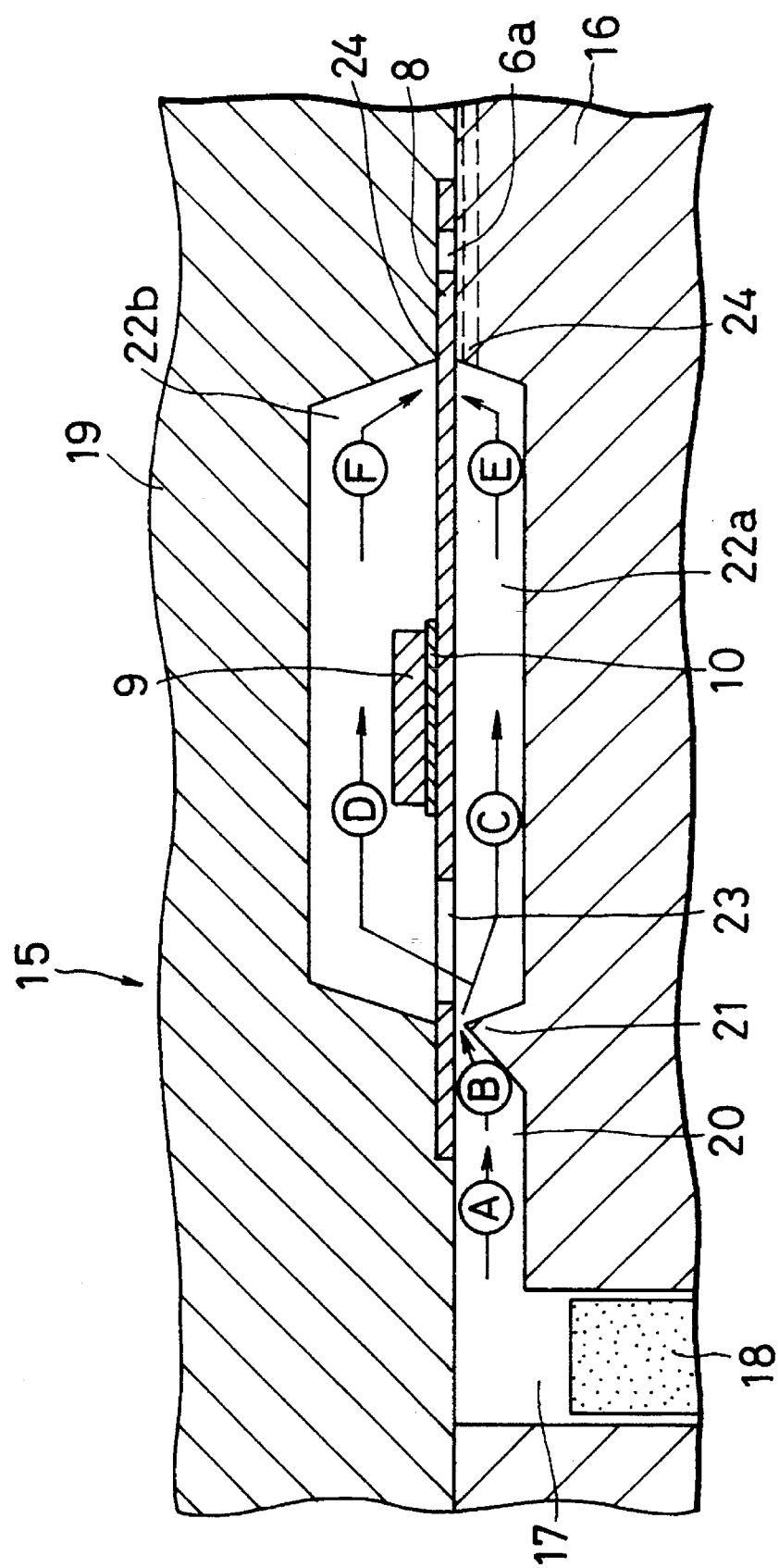
FIG. 6 is a partial cross-section showing the molding process of the leadframe of the first embodiment shown in FIG. 4 in detail.

A detailed description about the transfer-molding process shown in FIG. 5D is shown below referring to FIG. 6.

A molding material or synthetic resin 18 is preheated to a given temperature to melt and is temporarily stored in a pot 17 of a lower mold 16 of a molding die 15. The lower mold 16 has a cavity 22a. On the other hand, the leadframe 8 having the semiconductor chip 9 mounted and the bonding wire pieces 11 bonded is positioned on the lower mold 16 using the first and second pilot holes 6a and 6b as shown in FIG. 5C.

Subsequently, an upper mold 19 of the molding die 15, which has a cavity 22b, is lowered to be coupled with the lower mold 16, providing a molding space made of the cavities 22a and 22b in the molding die 15. At this time, the body of the leadframe 8 has been put between the upper and lower molds 15 and 16 so that the leadframe 8 is securely held. The LSI chip 9, the bonding-wire pieces 11 and the inner leads 1 are placed in the molding space.

A plunger (not shown) provided under the melted molding material 18 ascends to push out the material 18 stored in the pot 17 into a runner 20 of the lower mold 16. The melted material 18 flows in the runner 20 toward the lower cavity 22a as shown by an arrow A, passes through a gate 21 formed at an end of the runner 20 as shown by an arrow B, and go into the lower cavity 22a.

Since the runner 20 and the gate 21 are formed in the lower mold 16 and the leadframe 8 is placed at an interface of the upper and lower cavities 22a and 22b, the melted material 18 flows, first, into the lower cavity 22a as shown by an arrow C. The melted material 18 in the lower cavity 22a then flows into the upper cavity 22b through not only gaps or openings between the die pad 5 and the body of the leadframe 8 but also the through hole 23, as shown by an arrow D. Thus, the melted material 18 branches to flow in the upper and lower cavities 22a and 22b.

The melted material 18 flowing in the lower and upper cavities 22a and 22b goes toward opposite ends of the cavities 22a and 22b, as shown by arrows E and F, respectively, so that the cavities 22a and 22b are filled with the melted material 18.

During this filling process, the atmospheric air confined in the cavities 22a and 22b is discharged through an air vent 24 formed at the end of the lower mold 16 opposite to the gate 21.

The melted material 18 thus filled is then cured, and the semiconductor chip 9, the bonding wire pieces 11 and the die pad 5 are molded by the material 18, resulting in the plastic package 12 made of the material 18.

Subsequently, the upper mold 19 is raised to be apart from the lower mold 16, and the leadframe 8 with the semiconductor chip 9 thus molded are taken out from the lower cavity 22a.

The cured molding material 18 remaining at the runner 20 and the gate 21, that is, burrs or flushes, are then removed. Thus, the molding process step is finished.

With the leadframe 8 of the first embodiment, since one of the die pad supports 7 has the through hole 23 acting as the first communication path, the molding material 18 supplied into lower side of the body can flow to the other side thereof through both of the gaps between the die pad 5 and the body and the through hole 23 during the molding process. Therefore, the molding material 18 can flow into the lower and upper molding cavities 22a and 22b at a small flow rate difference, respectively.

As a result, there arises no fillings such as visible voids or bubbles and no fillings in the plastic-molding package 12.

Further, the leadframe 8 requires no additional process step such as a process step of removing the remaining molding material on the upper mold 19 during and after the molding process since no additional gate is provided in the upper mold 19.

To confirm the advantages or effects of the embodiment, one hundred (100) of the leadframes 8 were practically fabricated and one hundred LSIs were transfer-molded tested using the leadframes 8 under the following conditions:

The package type was a Quad Flat Package (QFP) with 304 pins or outer leads. Each of the gaps between the adjacent inner leads 1 and each of the gaps between the respective die pad supports 7 and the inner leads 1 adjacent thereto are both 100 μm.

The results of the test said that the visible voids or bubbles and the "no filling" were not found in any of the packages thus molded, meaning the failure rate of 0%.

Because the molding material 18 used in the test contained as a filler material silica ($SiO_2$) particles whose maximum diameter is 100 μm, the through hole 23 as the first communication path needs to have the maximum width larger than 100 μm to avoid insufficient filling of the molding material.

Preferably, to ensure the effect or action of the hole 23, the maximum width of the hole 23 is 150 μm or larger.

In general, due to the through hole 23 formed in the die pad support 7, the mechanical strength of the support 7 tends to lower so that the die pad 5 is easily shifted upper or lower direction from a designed position by the flowing molding material the during the molding process. In the case of an extremely large shift, there arises a problem of exposure of the bonding wire pieces 11 and the LSI chip 9 or that of the die pad 5.

Therefore, to ensure the mechanical strength of the die pad support 7 sufficient for withstanding the flowing molding material, it was found that the maximum width of the through hole 23 was preferably 80% of the width of the die pad support 7 or less. The condition about the maximum width needs to be satisfied at the entire length of the through hole 23.

More preferably, it was also found that the maximum width of the through hole 23 was 50% of the width of the die pad support 7 or less to provide sufficient mechanical strength for withstanding the flowing molding material, providing improvement in endurance of the package 12.

For example, in the case that the maximum width of the die pad support 7 is 0.4 mm, the maximum width of the die pad support 7 is preferably 0.32 mm or less.

[SECOND EMBODIMENT]

Figure 7:
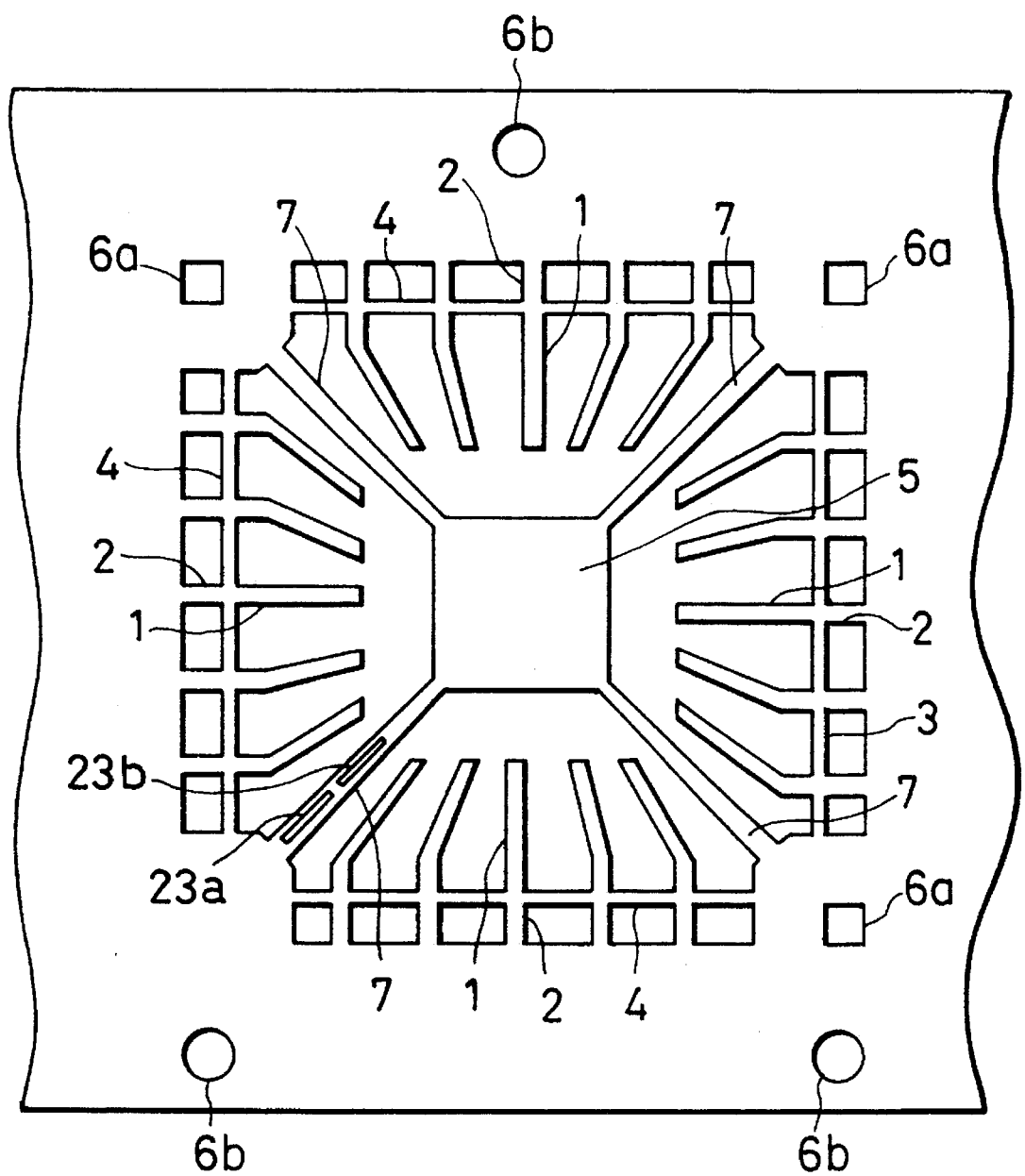
FIG. 7 is a partial plan view of a leadframe for semiconductor devices according to a second embodiment of the present invention.

FIG. 7 shows a leadframe for semiconductor devices according to a second embodiment. This leadframe 8a is the same in configuration as the leadframe 8 shown in FIG. 4 except that through holes 23a and 23b are formed in the same die support pad 7 as the first communication path. The holes 23a and 23b are equivalent to division of the hole 23 in the leadframe 8.

In the leadframe 8a of the second embodiment, since the through holes 23a and 23b are provided apart from each other in the same support 7, the mechanical strength of the support 7 increases. As a result, there arises an additional advantage that the molding material can be supplied more stably into the cavities 22a and 22b without an extremely large shift of the die pad 5 than the leadframe 8 of the first embodiment.

The same test as the first embodiment was carried out for the second embodiment. As a result, the visible voids or bubbles and the "no filling" were not found in any of the packages molded, meaning the failure rate of 0%.

Also with the leadframe 8a, no additional process step such as a process step of removing the remaining molding material on the upper mold 19 is required during and after the molding process.

[THIRD EMBODIMENT]

Figure 8:
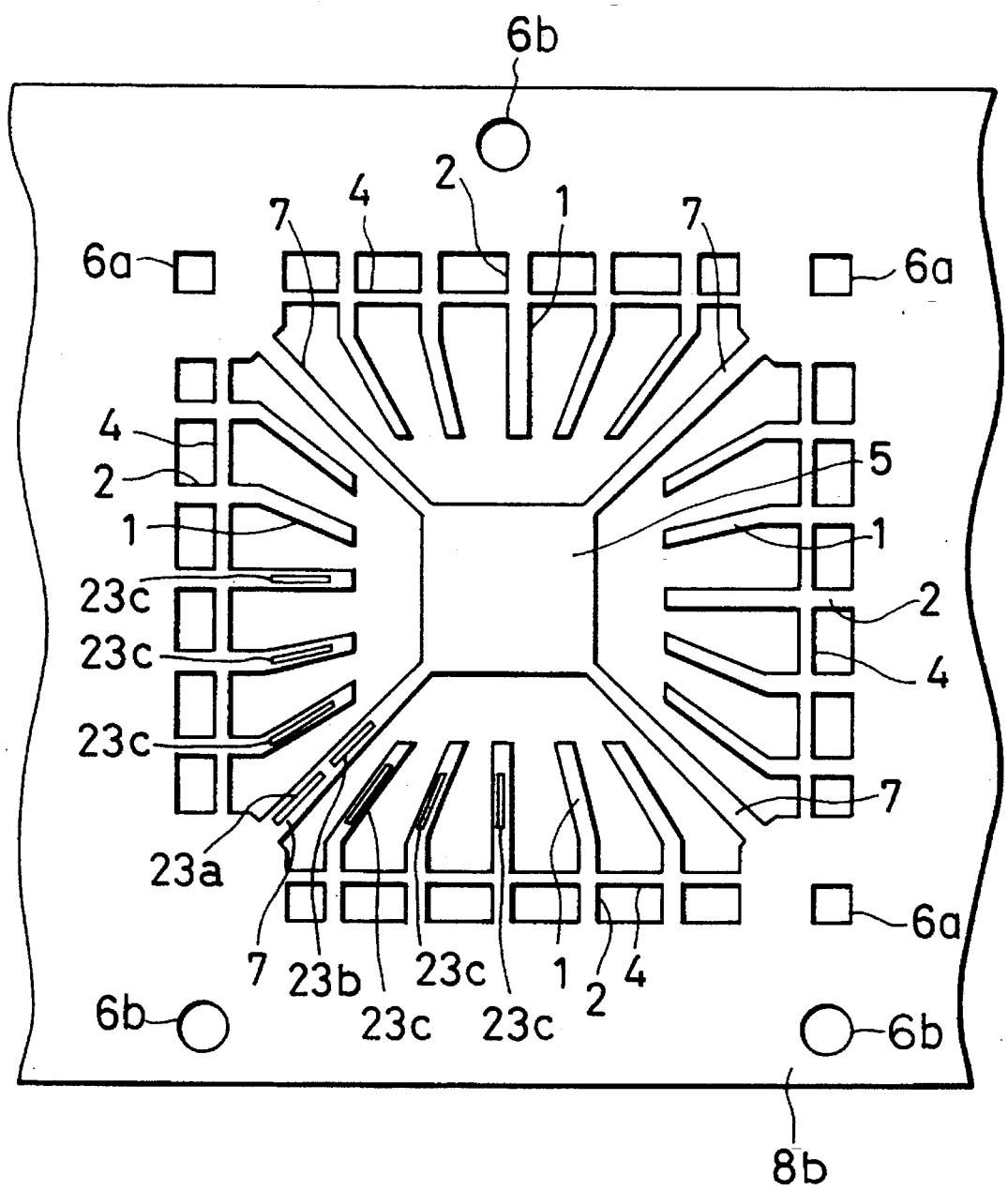
FIG. 8 is a partial plan view of a leadframe for semiconductor devices according to a third embodiment of the present invention.

FIG. 8 shows a leadframe for semiconductor devices according to a third embodiment. This leadframe 8b is the same in configuration as the leadframe 8a shown in FIG. 7 except that six through holes 23c acting as a second communication path are additionally formed in the six inner leads 1 near the die pad support 7 with the through holes 23a and 23b, respectively.

One half of the six through holes 23c are respectively provided in the three inner leads 1 disposed along the side parallel to the longitudinal axis of the body. The other of the holes 23c are respectively provided in the three inner leads 1 disposed along the side perpendicular to the longitudinal axis thereof.

In the leadframe 8b of the third embodiment since the through holes 23c are provided in the inner leads 1 in addition to the through holes 23a and 23b, the molding material 18 supplied into lower side of the body can flow to the other side thereof through the gaps between the die pad 5 and the body, the through holes 23a and 23b, and the through holes 23c during the molding process. Therefore, compared with the first and second embodiments, the molding material 18 can flow into both of the lower and upper molding cavities 22a and 22b at a smaller flow rate difference.

The same test as the first embodiment was carried out for the third embodiment. As a result, similar to the first and second embodiments, the visible voids or bubbles and the "no filling" were not found in any of the packages molded, meaning the failure rate of 0%.

In the case that the molding material 18 is difficult to pass through the through holes 23a and 23b due to the maximum diameter of the filler particles contained in the molding material 18, the through holes 23c formed in the inner leads 1 can be designed so that the filler particles can easily pass through the holes 23c. As a result, there is an additional advantage that the molding material can flow from the lower cavity 22a to the upper cavity 22b without enlarging the maximum width of the through holes 23a and/or 23b, in other words, without reducing the mechanical strength of the die pad support 7.

Similar to the first and second embodiments, also with the leadframe 8b, no additional process step such as a process step of removing the remaining molding material on the upper mold 19 is required during.

In the first to third embodiments described above, though the runner 20 and the gate 21 are provided at the lower mold 16, they may be provided at the upper mold 19. The runner 20 and the gate 21 may be any positions at the lower or upper mold 16 or 17.

While the preferred forms of the present invention has been described, it is to be understood that modifications will be apparent to those skilled in the art without departing from the spirit of the invention. The scope of the invention, therefore, is to be determined by the following claims.

What is claimed is:

1. A leadframe for semiconductor devices comprising:
   (a) a body;
   (b) first and second rails extending along a longitudinal axis of said body, said first and second rails being formed at each side of said body; and
   (c) patterned die-mounting structures arranged along said longitudinal axis between said first and second rails; each of said structures including:
       a die pad for mounting a semiconductor device chip thereon;
       die pad supports for supporting said die pad, said die pad supports being formed to extend from said body to said die pad thereby to support said die pad;
       at least one of said die pad supports having a first communication path that communicates one side of said body with the other thereof, said first communication path being formed to extend along said corresponding die pad support for a designated length and a designated width;
       fingers for forming inner leads and outer leads;
       said outer leads being made by outer parts of said fingers, respectively, and being connected to said body;
       said inner leads being made by inner parts of said fingers, respectively and not reaching said die pad;
   wherein when said leadframe is held by a molding die having a molding space in which a molding material is supplied and a gate through which said molding material is admitted during a molding process:
   and wherein said die pad, said die pad supports, and said inner leads are located in said molding space to divide said space into first and second parts:
   and wherein said gate is located in said first part, and said first communication path is located in the vicinity of said gate;
   and wherein said molding material supplied from said gate into said first part flows through said first communication path to said second part, thereby filling said first and second parts approximately uniformly.

2. A leadframe as claimed in claim 1, wherein said first communication path is made by a single first through hole formed in said at least one of said die pad supports.

3. A leadframe as claimed in claim 1, wherein said first communication path is made by a plurality of first through holes formed in said at least one of said die pad supports.

4. A leadframe as claimed in claim 1, further comprising a second communication path formed in at least one of said inner leads:
   wherein said second communication path communicates one side of said body with the other side thereof and is formed to extend along said corresponding inner lead for a designated length and a designated width.

5. A leadframe as claimed in claim 4, wherein said second communication path is positioned nearest to a gate of said molding die during said molding process, said molding material being supplied into said molding space through said gate.

6. A leadframe as claimed in claim 4, wherein said second communication path is made by a single second through hole.

7. A leadframe as claimed in claim 4, wherein said second communication path is made by a plurality of second through holes.

8. A leadframe as claimed in claim 7, wherein said plurality of second through holes are respectively formed on corresponding ones of said inner leads in the vicinity of a gate of said molding die during said molding process, said molding material being supplied into said molding space through said gate.

9. A leadframe as claimed in claim 1, wherein said first communication path is formed to extend along a direction in which said molding material flows in said molding space of said molding die.

10. A leadframe as claimed in claim 1, wherein said width of said first communication path decreases from said body toward said die pad.

11. A leadframe as claimed in claim 1, wherein said first communication path is formed to extend along a direction in which said molding material flows in said molding space of said molding die during said molding process.

12. A leadframe for semiconductor devices comprising:
   (a) a die pad for mounting a semiconductor device chip thereon, said die pad being placed between first and second rails arranged in parallel;
   (b) a first die pad support for connecting said die pad to said first and second rails, said first die pad support having a first through hole;
   (c) a second die pad support for connecting said die pad to said first and second rails; and
   (d) lead fingers formed between said first and second rails, each of lead fingers having an end connected to one of said first and second rails and the other end extended to the vicinity of said die pad;
   wherein when said leadframe is held by a molding die having a molding space in which a molding material is supplied and a gate through which said molding material is admitted during a molding process:
   and wherein said die pad, said first and second die pad supports, and said lead fingers are located in said molding space to divide said space into first and second parts:
   and wherein said gate is located in said first part, and said first through hole is located in the vicinity of said gate:
   and wherein said molding material supplied from said gate into said first part flows through said first through hole to said second part, thereby filling said first and second parts approximately uniformly.

13. A leadframe as claimed in claim 12, wherein said first through hole is made by a single first hole formed in said first die pad support.

14. A leadframe as claimed in claim 12, wherein said first through hole is made by a plurality of holes formed in said first die pad support.

15. A leadframe as claimed in claim 12, further comprising a second through hole formed in at least one of said inner leads wherein said second through hole communicates one side of said body with the other side thereof and is formed to extend along said corresponding inner lead for a designated length and a designated width.

16. A leadframe as claimed in claim 15, wherein said second through hole is positioned nearest to a gate of said molding die during said molding process, said molding material being supplied into said molding space through said gate.

17. A leadframe as claimed in claim 15, wherein said second through hole is made by a single hole.

18. A leadframe as claimed in claim 15, wherein said second through hole is made by a plurality of holes.

19. A leadframe as claimed in claim 18, wherein said plurality of holes are respectively formed on corresponding ones of said leads fingers in the vicinity of a gate of said molding die during said molding process, said molding material being supplied into said molding space through said gate.

20. A lead frame as claimed in claim 12, wherein said first through hole is formed to extend along a direction in which said molding material flows in said molding space of said molding die.

21. A leadframe as claimed in claim 12, wherein said width of said first through hole decreases from said body toward said die pad.

22. A leadframe as claimed in claim 12, wherein said first through hole is formed to extend along a direction in which said molding material flows in said molding space of said molding die during said molding process.

23. A leadframe for semiconductor devices comprising:
(a) a die pad for mounting a semiconductor device chip thereon, said die pad being placed between first and second rails arranged in parallel;
(b) a first die pad support for connecting said die pad to said first and second rails;
(c) a second die pad support for connecting said die pad to said first and second rails; and
(d) lead fingers formed between said first and second rails, each of lead fingers having an end connected to one of said first and second rails and the other end extended to the vicinity of said die pad, at least one of said lead fingers having a first through hole;

wherein when said leadframe is held in a molding die having molding space in which a molding material is supplied and a gate through which said molding material is admitted;

and wherein said die pad, said first and second die pad supports, and said lead fingers are located in said molding space to divide said space into first and second parts;

and wherein said gate is located in said first part, and said first through hole of said at least one of said lead fingers is located in the vicinity of said gate;

and wherein said molding material supplied from said gate into said first part flows through said first through hole to said second part, thereby filling said first and second parts approximately uniformly.

24. A leadframe as claimed in claim 23, wherein said first through hole is made by a single hole formed in at least one lead finger.

25. A leadframe as claimed in claim 24, wherein said first through hole is made by a plurality of holes formed in at least one lead finger.

26. A leadframe as claimed in claim 23, wherein said first through hole is formed to extend along a direction in which said molding material flows in said molding space of said molding die.

* * * * *